(12) United States Patent  (10) Patent No.: US 8,091,413 B2
Saito et al.  (45) Date of Patent: Jan. 10, 2012

(54) MASS AIR FLOW MEASUREMENT DEVICE

(75) Inventors: Takayuki Saito, Hitachinaka (JP);
Takayuki Yogo, Hitachinaka (JP);
Shinya Igarashi, Naka (JP); Hiromu Kikawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 70 days.

(21) Appl. No.: 12/508,325

(22) Filed: Jul. 23, 2009

(65) Prior Publication Data
US 2010/0031737 A1 Feb. 11, 2010

(30) Foreign Application Priority Data
Aug. 11, 2008 (JP) ................................ 2008-206518

(51) Int. Cl.
*G01M 15/04* (2006.01)
(52) U.S. Cl. ................. 73/114.33; 73/114.34
(58) Field of Classification Search .. 73/114.32–114.34, 73/204.11–204.27
See application file for complete search history.

(56) References Cited

U.S. PATENT DOCUMENTS

| | | | | |
|---|---|---|---|---|
| 4,083,244 A * | 4/1978 | Agar et al. | ................. | 73/204.21 |
| 6,012,432 A * | 1/2000 | Igarashi et al. | ............... | 123/494 |
| 6,581,447 B1 | 6/2003 | Strohrmann et al. | | |
| 7,174,782 B2 * | 2/2007 | Ice | .............................. | 73/204.22 |
| 7,219,543 B2 * | 5/2007 | Tanaka et al. | .............. | 73/204.22 |
| 7,305,878 B2 * | 12/2007 | Tanaka et al. | .............. | 73/204.26 |
| 7,370,526 B1 * | 5/2008 | Ice | .............................. | 73/204.22 |
| 7,520,051 B2 * | 4/2009 | Becke et al. | .................... | 29/832 |
| 7,640,798 B2 * | 1/2010 | Oda | ........................... | 73/204.26 |
| 2005/0193812 A1 * | 9/2005 | Ice | .............................. | 73/170.02 |
| 2008/0163683 A1 * | 7/2008 | Becke et al. | .................... | 73/431 |

FOREIGN PATENT DOCUMENTS

| | | |
|---|---|---|
| GB | 1 512 290 A | 6/1978 |
| JP | 58-117333 A | 7/1983 |
| JP | 7-229776 A | 8/1995 |
| JP | 9-96552 A | 4/1997 |
| JP | 10-197305 A | 7/1998 |
| JP | 3523022 B2 | 1/1999 |

OTHER PUBLICATIONS

European Search Report dated Dec. 11, 2009 (Three (3) pages).

* cited by examiner

*Primary Examiner* — Freddie Kirkland, III
(74) *Attorney, Agent, or Firm* — Crowell & Moring LLP

(57) ABSTRACT

An arrangement of a mass intake air flow measurement device suitable for integrating a humidity sensing device as well as a temperature sensing device and a pressure sensing device is provided. A second bypass passage bypassing a bypass passage is formed and a humidity sensing device is mounted in the second bypass passage. A second bypass passage inlet and a second bypass passage outlet formed in a wall surface of the bypass passage are opened parallel to the direction of flow of air flowing in the bypass passage.

10 Claims, 8 Drawing Sheets

A-A

MASS AIR FLOW MEASUREMENT DEVICE

BACKGROUND OF THE INVENTION

1. Field of the Invention

The present invention relates to a heating resistor type mass air flow measurement device suitable for measuring the flow of intake air in an internal combustion engine and to an internal combustion engine using the mass air flow measurement device.

2. Background Art

A heating resistor type mass air flow measurement device is known as a flow measurement art for internal combustion engines (see JP Patent No. 3523022). This device utilizes a correlation between an inflow and the amount of heat removed from a heating resistor and is capable of directly measuring the mass flow required in engine combustion control. Therefore this device is being widely used as a flowmeter for air/fuel ratio control especially in motor vehicles.

As a sensor formed by integrating, for example, a flow measurement device, a pressure sensing device and a humidity sensing device for an internal combustion engine and capable of measuring a plurality of physical quantities, an example of an integrated combination of a humidity sensor and a pressure sensor is referred to in relation to the present invention as a known technique (see JP Patent Publication (Kokai) No. 9-96552A (1997)).

SUMMARY OF THE INVENTION

In recent years, motor vehicles using electronically controlled fuel injection systems have been made common. In engine rooms of such motor vehicles, various sensors and control devices are disposed in a crowded fashion. Also, wire harnesses which connect such various sensors and control devices, a control unit for controlling the sensors and control devices to each other are considerably complicated.

There is, therefore, a demand for reducing the number of component parts and improving the engine room interior view by integrating a plurality of sensors and control devices. An example of measures to meet such a demand is integrating the above-described heating resistor type mass air flow measurement device, a temperature sensing device, a semiconductor type pressure sensing device and a temperature sensing device and using a common connector. In this way, a reduction in the number of steps of mounting component parts in a vehicle and simplification of wire harnesses can be achieved.

The structure in which the above-described heating resistor type mass air flow measurement device and a temperature sensing device are integrated has gone mainstream. However, various technical problems will arise with further integration of other devices such as the above-mentioned pressure sensing device and humidity sensing device in future.

In particular, no practical use in fuel control has been made of any humidity sensing device corresponding to that mentioned above. Humidity sensing devices have been used mainly for air conditioning in vehicle cabins or the like. For use in a vehicle cabin, no such requirement as a durability requirement made by assuming use in a severe environment exists. For use in engine control, for example, in a state of being integrated with the above-mentioned heating resistor type mass air flow measurement device and sensors or the like, however, a hostile-environment performance equivalent to that of the heating resistor type mass air flow measurement device is required. An environment hostile to a humidity sensing device in particular is an environment in which a sensing element portion can be contaminated or a droplet of water can attach to a humidity sensing element portion as a result of dew condensation or permeation of rainwater. A definite technical solution to the problem of these phenomena is indispensable.

For example, when the sensing element of the humidity sensing device is contaminated, a considerable delay occurs in sensing response to a change in humidity and the humidity measurement accuracy is badly influenced. When a droplet of water is attached to the humidity sensing portion, a signal value representing the maximum humidity or minimum humidity is output, depending on the construction of the sensor and the configuration of a peripheral circuit associated with the sensor, and the function of the humidity sensing device is temporarily lost before the attached droplet of water disappears. This condition badly influences the engine control system during the period when function of the humidity sensing device is lost.

An object of the present invention is to provide an arrangement of a mass intake air flow measurement device suitable for integrating a humidity sensing device as well as a temperature sensing device and a pressure sensing device.

In consideration of the above-described problems, an attention was paid to the structure and function of a bypass passage used in the conventional mass air flow measurement device.

In a mass air flow measurement device, a mass air flow sensing element for sensing a mass air flow is mounted in a bypass passage. The bypass passage has the effect of regulating the flow of air, the effect of preventing a contaminant from entering the bypass passage, and the effect of, in the event of entry of a contaminant in the bypass passage, separating the contaminant from air in the bypass passage in an inertial separation manner and thereby preventing the contaminant from directly contaminating the mass air flow sensing element.

In ordinary environments in which the mass air flow measurement device is used, the bypass passage incorporating the mass air flow sensing element is used in combination with any of air cleaner ducts and air cleaner boxes of various shapes. In such environments, therefore, various cases, varying in the direction of flow of air in the duct with respect to the direction of placement of the bypass passage, the degree of air turbulence, and the possibility of entering of floating materials such as contaminants and droplets of water, can occur. That is, while the bypass passage has a flow regulation effect and special effects on contaminations as described above, it is difficult to constantly form a uniform flow and create an environment uniform with respect to contaminations in such various severe environments.

One of the reasons why the bypass passage can be used in a functionally effective state in spite of such a condition is that a heating resistor strong against contamination and attachment of a droplet of water is used as a sensing element in the bypass passage, for example, as in the case of a heating resistor type mass air flow measurement device. In a case where the bypass passage is used, for example, for a humidity sensing element inferior in resistance to a severe environment, the possibility of the humidity sensing element being contaminated by a contaminant in air or being influenced by droplets of water flying with the air to the element is increased.

In an arrangement in which a mass air flow measurement device and a humidity sensing device in particular are integrated, therefore, full use is made of the functions of the bypass passage used in the above-described mass air flow measurement device to provide clean intake air to the integrated humidity sensing element.

The flow regulating effect of the bypass passage, particularly the effect of regulating the flow in the bypass passage in an expected direction at all times is utilized; a second bypass passage opened parallel to the direction of flow in the bypass passage is provided; and the humidity sensing element is mounted in the second bypass passage. Most of contaminants, droplets of water and the like floating in air are materials of large specific gravities relative to air. When such floating materials flow into the bypass passage while floating in air, it is difficult for the floating materials to flow into the second bypass passage having the inlet opened parallel because of their inertial force. Further, this effect can be improved by opening the inlet in a direction at a certain angle such that it is more difficult for the floating materials to flow into the inlet.

Due to the configuration having the effect of making taking contaminants and droplets of water into the second bypass passage difficult, there is a possibility of failure to cause an amount of air sufficient for sensing of humidity to flow through the second bypass passage. These conditions influence the humidity sensing accuracy and delay in measurement response. It is, therefore, necessary to construct a configuration improved both in terms of performance and in terms of reliability.

An arrangement capable of generating an air flow in the above-mentioned second bypass passage is advantageous in terms of response and measurement accuracy in humidity measurement. Further, in the event of an unexpected condition, e.g., a situation where water generated by dew condensation or water flying to the measurement device enters the second bypass passage, the arrangement enables removing a droplet of water attached to the sensor to the downstream side by the generated air flow. Even in a case where the second bypass passage is formed so as to simply bypass a portion of the bypass passage, a certain pressure difference can be produced between the inlet and the outlet of the second bypass passage to generate some amount of air flow. In a case where the necessary flow rate is positively obtained with intention, however, a flow constriction structure may be provided in some position in the bypass passage and between the inlet and outlet of the second bypass passage. By this flow construction structure in the bypass passage, a large pressure difference is obtained between the inlet and outlet of the second bypass passage. An air flow is generated in the second bypass passage by this pressure difference.

If the inlet of the second bypass passage is placed on the upstream side of the bypass passage, and if the outlet of the second bypass passage is placed, for example, in the vicinity of a bend of the bypass passage, creating a pressure difference between the inlet and outlet of the second bypass passage is made easier. An air flow can be generated in the second bypass passage in this way.

With this arrangement, the flow rate in the second bypass passage can be increased without taking any contaminant or any droplet of water into the second bypass passage, and a configuration improved both in terms of performance and in terms of reliability can be formed.

In a case where a pressure sensing device is further added to the arrangement in which the above-described mass air flow measurement device and the humidity sensing device are integrated, solutions to anxieties described below are required.

A pressure intake pipe of the pressure sensing device is ordinarily formed of a thin pipe, because an error occurs in pressure sensing when dust, water or the like enters a pressure sensing part. The pressure sensing part is formed of a semiconductor-type silicon diaphragm and is therefore provided in a considerably small structure. It is, therefore, necessary that the pressure intake pipe have such a structure that dust, water and the like cannot easily enter the pressure intake pipe.

On the other hand, if water enters the pressure intake pipe in a case where the pressure intake pipe is a thin pipe, forming of water film, congelation of water or the like can occur easily to reduce the pressure sensing accuracy. An air cleaner box is placed upstream of an air intake tube of an internal combustion engine, and air from which dust and the like in the atmosphere have been removed is fed into the engine. However, the dust collecting ability of the air cleaner is not perfect; fine dust components or the like can pass through the air cleaner box to be taken into the engine via the air intake tube. Since the pressure intake pipe of the pressure sensing device is placed in a state of being exposed to air in the air intake tube, entering of dust such as that mention above occurs. Water can be caught by an air cleaner filter but permeates into the filter because of its water form and is released to the air intake tube when the amount of water exceeds the maximum allowable capacity in the filter. There is a possibility of the released water reaching the pressure intake pipe.

As a measure against the above described anxieties, an arrangement is adopted in which the pressure intake pipe of the pressure sensing device is connected to the second bypass passage incorporating the humidity sensing device, that is, a pressure intake port is opened in the second bypass passage. Since the second bypass passage has a configuration such as not to take in contaminants, droplets of water and the like as described above, pressure taking-in from the second bypass passage can be performed with a reduced possibility of contamination of the pressure sensing device. Further, the pressure sensing device may be mounted in a position set as remote as possible from the second bypass passage to enable the pressure intake pipe to be formed longer so that the possibility of a contaminant or a droplet of water reaching the silicon diaphragm is close to zero. The position of the pressure sensing device in such a case is, for example, the outside of an outer wall surface of a member constituting the air intake tube.

Many people in the world are presently focusing their attention to environmental problems such as global warming. With above-described arrangement of the present invention, the number of component parts of internal combustion engine control devices can be reduced to contribute to reductions in the amounts of resource materials. Further, changes with time in various sensors including heating resistor type mass air flow measurement devices, humidity sensing devices, pressure sensing devices and temperature sensing devices can be reduced for the purpose of providing high-accuracy fuel control indispensable to both conformity with exhaust gas regulations and conformity with fuel consumption regulations for a long period of time. The present invention thus enables supply of an earth-friendly, low-fuel-consumption, clean-exhaust-gas engine control system to the market.

More specifically, as a result of connection of the second bypass passage to the bypass passage, a configuration improved both in terms of performance and in terms of reliability in humidity measurement can be provided to increase the flow rate in the second bypass passage without taking any contaminant or any droplet of water into the second bypass passage.

DESCRIPTION OF SYMBOLS

Figure 1:
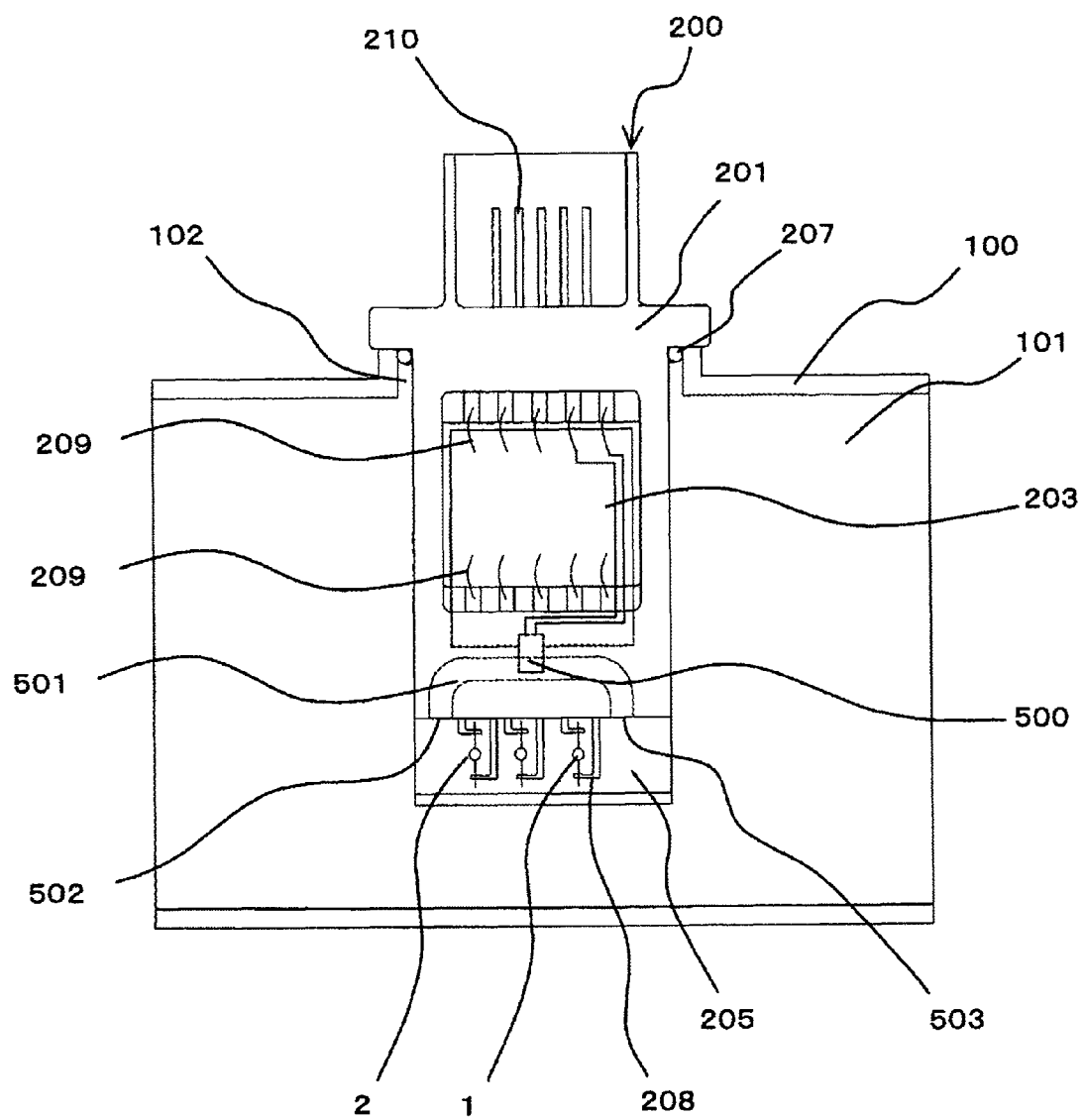
FIG. 1 is a diagram showing the construction of a mass air flow measurement device representing an embodiment of the present invention.

1 Heating resistor
2 Air temperature sensing part
50 Air cleaner box
51 Intake air
52 Flow tube
53 Intake air duct
54 Throttle body
55 Fuel injector
56 Intake manifold
57 Engine cylinder
58 Gas
59 Exhaust manifold
60 Integrated bypass type mass airflow sensor
61 Throttle angle sensor
62 Oxygen meter
63 Engine speed meter
64 Engine control unit
65 Idle air control valve
100 Flow tube member
101 Main flow passage
102 Device insertion slot
200 Heating resistor type mass air flow measurement device
201 Housing member
202 Base plate member
203 Circuit substrate
204 Cover member
205 Bypass passage
206 Bypass passage member
207, 401, 504 Seal member
208 Terminal member
209 Bonding member
210 Connector terminal
211 Structural step in the bypass passage
400 Pressure sensing device
402 Pressure intake pipe
403 Input-output terminals
500 Humidity sensing device
501 Second bypass passage
502 Second bypass passage inlet
503 Second bypass passage outlet

DETAILED DESCRIPTION OF THE PREFERRED EMBODIMENTS

Embodiments of the present invention will be described below.

A concrete example of an arrangement according to the present invention will be described with reference to FIGS. 1 and 2. FIG. 2 is a front view of the arrangement shown in FIG. 1.

In a portion of a flow tube member (intake tube member) 100 forming a main flow passage (also referred to as an intake passage or simply as an intake tube) 101, a device insertion slot 102 in which a portion of a heating resistor type mass air flow measurement device 200 is inserted is provided. The heating resistor type mass air flow measurement device 200 integrally incorporating a humidity sensing device 500 is placed in the device insertion slot 102. A housing member 201 provided as a case member for the heating resistor type mass air flow measurement device 200 is attached to the intake tube member 100 to function.

Members constituting the heating resistor type mass air flow measurement device 200 as well as the housing member 201 include a base plate member 202 made of a metallic material or the like, a cover member 204 for protecting a circuit substrate 203, a heating resistor 1 for measuring the air flow, a bypass passage member 206 for forming a bypass passage 205 in which the heating resistor 1 is placed, and a seal member 207 for sealing between the main flow passage 101 and the outside. An inlet of the bypass passage 205 is opened perpendicularly to the direction of flow of air flowing in the main flow passage 101.

A second bypass passage 501 is opened in the bypass passage 205. The second bypass passage 501 is formed so as to bypass the bypass passage 205. The humidity sensing device 500 is provided in the second bypass passage 501. The humidity sensing device 500 is mounted and fixed on the circuit substrate 203 with a die bonding material (not shown) or the like.

An electrical signal relating to the heating resistor type mass air flow measurement device 200 is connected from the heating resistor 1 to a connector terminal 210 via a terminal member 208, a bonding member 209, the circuit substrate 203 and a bonding member 209 to be electrically connected to an electronic control unit (ECU) or the like.

A signal from the humidity sensing device 500 is connected to the connector terminal 210 via bonding members 209 to be electrically connected to the ECU or the like.

A second bypass passage inlet 502 and a second bypass passage outlet 503, which respectively are an inlet and an output of the second bypass passage 501, are opened in a wall surface of the bypass passage 205 parallel to the direction of flow of air in the bypass passage 205.

Figure 2:
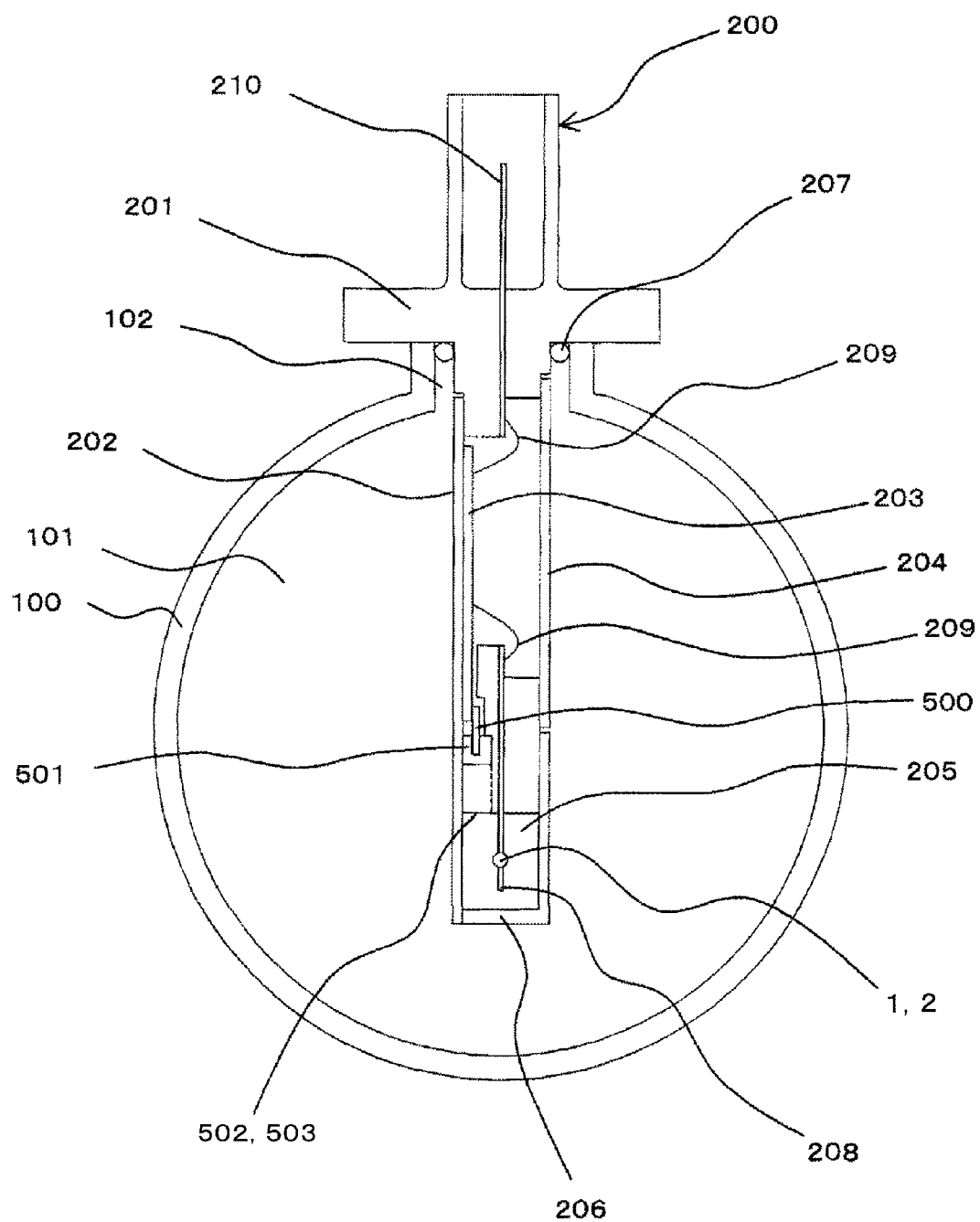
FIG. 2 is a front view of the construction of the mass air flow measurement device shown in FIG. 1.
Figure 3:
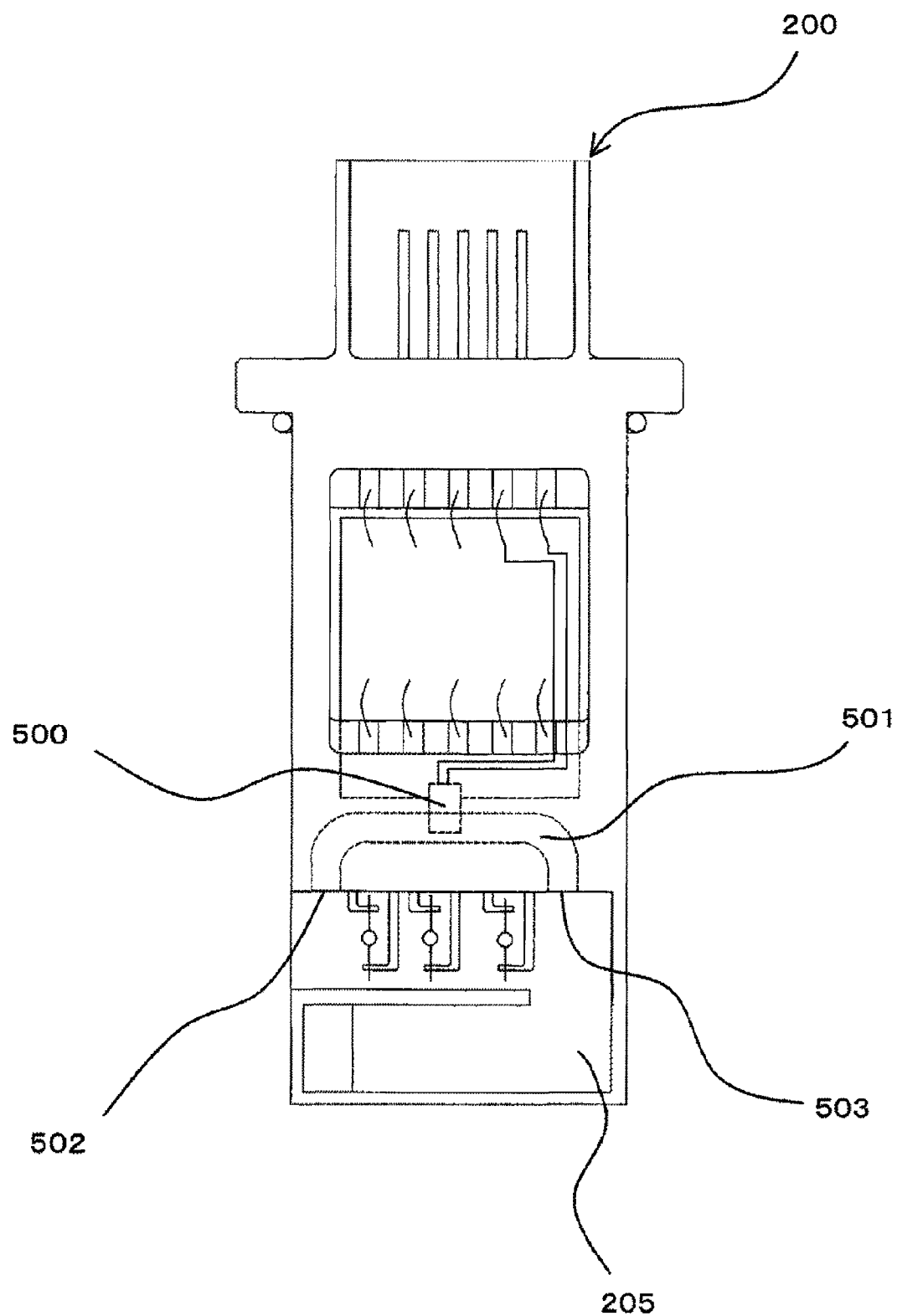
FIG. 3 is a diagram showing the construction of a mass air flow measurement device representing another embodiment of the present invention.

FIG. 3 shows an example of a modification of the shape of the bypass passage in contrast with that shown in FIGS. 1 and 2. While the bypass passage 205 of the heating resistor type mass air flow measurement device 200 shown in FIG. 1 is formed straight, a portion of the bypass passage 205 shown in FIG. 3 has a bent shape. The bypass passage 205 ordinarily has one or more bends to improve various expected performances of the heating resistor type mass air flow measurement device 200. For example, the effect of reducing the influence of a flow generated in the main flow passage and having a reverse flow component is expected as an effect of a bend.

In the heating resistor type mass air flow measurement device 200 integrally incorporating the humidity sensing device 500, the provision of a bend in the bypass passage 205 in a similar way facilitates producing a pressure difference between the second bypass passage inlet 502 and the second bypass passage outlet 503, and an air flow can be positively produced in the second bypass passage 501 by utilizing the pressure difference. Enabling increasing the air flow rate at the humidity sensing device 500 provides the advantage of improving the humidity measurement accuracy and the response.

Enabling increasing the air flow rate also provides the advantage of instantly discharging a droplet of water by the air flow even in the event of an unexpected phenomenon such as entering of a droplet of water through the second bypass passage inlet 502 or production of a droplet of water in the second bypass passage 501 by dew condensation.

Figure 4:
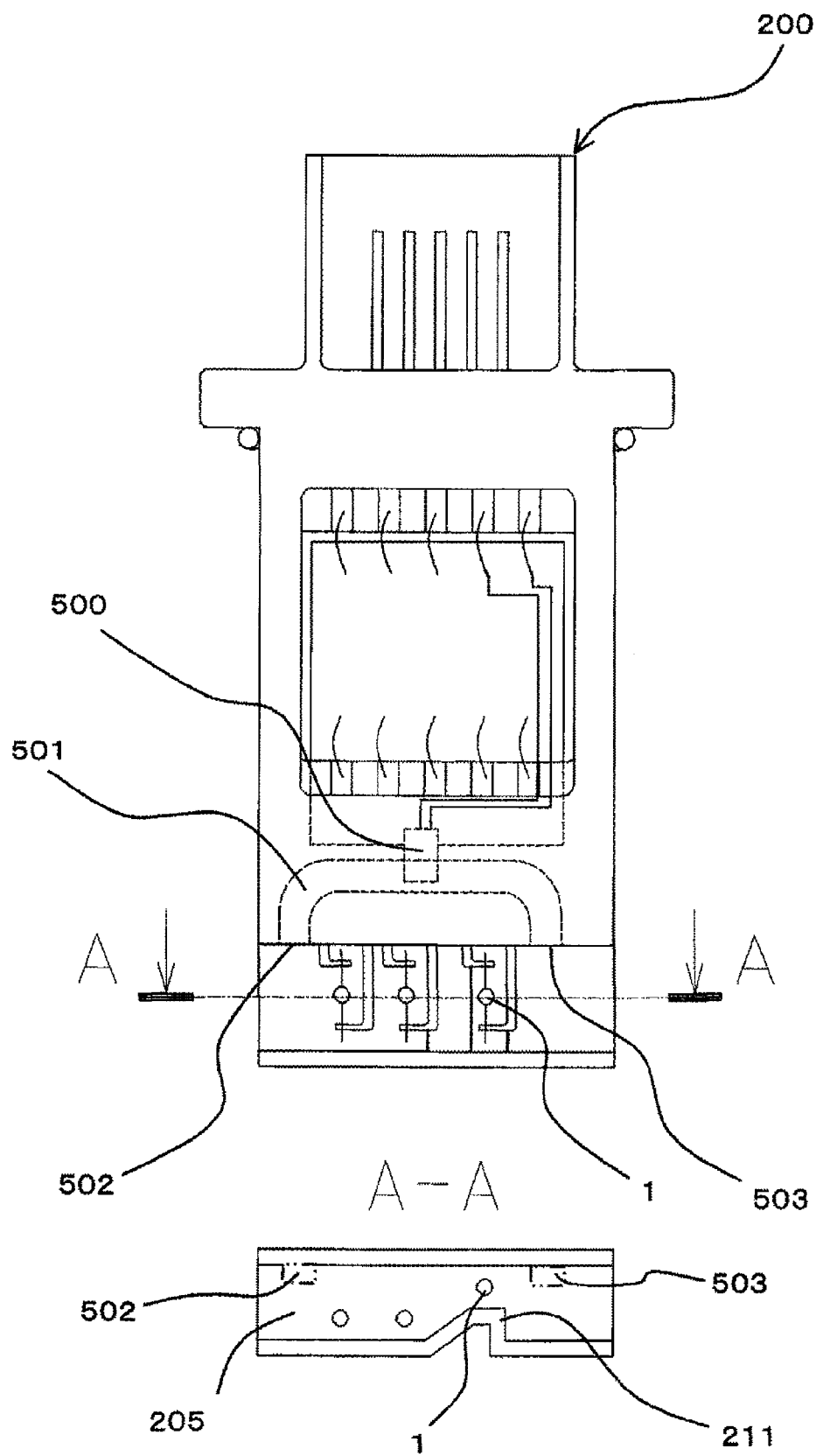
FIG. 4 is a diagram and a sectional view showing the construction of a mass air flow measurement device representing another embodiment of the present invention.

FIG. 4 shows another example of a modification of the shape of the bypass passage in contrast with that shown in FIGS. 1 and 2. FIG. 4 comprises a sectional view taken along line A-A. Referring to FIG. 4, the bypass passage 205 is formed straight, as is the bypass passage 205 of the heating resistor type mass air flow measurement device 200 shown in FIGS. 1 and 2, but the flow in the bypass passage 205 is constricted. The structure for this flow constriction is characterized by being formed by a structural step 211 in the bypass passage so that the air flow rate is increased at the heating resistor 1. Improving the flow rate at the heating resistor 1 is indispensable for improving various performances required of the heating resistor type mass air flow measurement device 200.

Section A-A of FIG. 4 is a sectional view of the bypass passage, showing that the structural step 211 in the bypass passage shown in FIG. 4 is placed in the bypass passage 205 and between the second bypass passage inlet 502 and the second bypass passage outlet 503. The structural step 211 in the bypass passage is capable of producing a large pressure difference between upstream and downstream sides of the place in which it is placed. That is, a large pressure difference can be produced between the second bypass passage inlet 502 and the second bypass passage outlet 503 by placing the structural step 211 in the bypass passage between the second bypass passage inlet 502 and the second bypass passage outlet 503. By this effect, the rate of flow of air flowing in the second bypass passage 501 can be further increased.

Enabling increasing the air flow rate at the humidity sensing device 500 provides the advantage of improving the humidity measurement accuracy and the response, and the advantage of instantly discharging a droplet of water by the air flow even in the event of an unexpected phenomenon such as entering of a droplet of water through the second bypass passage inlet 502 or production of a droplet of water in the second bypass passage 501 by dew condensation.

Figure 5:
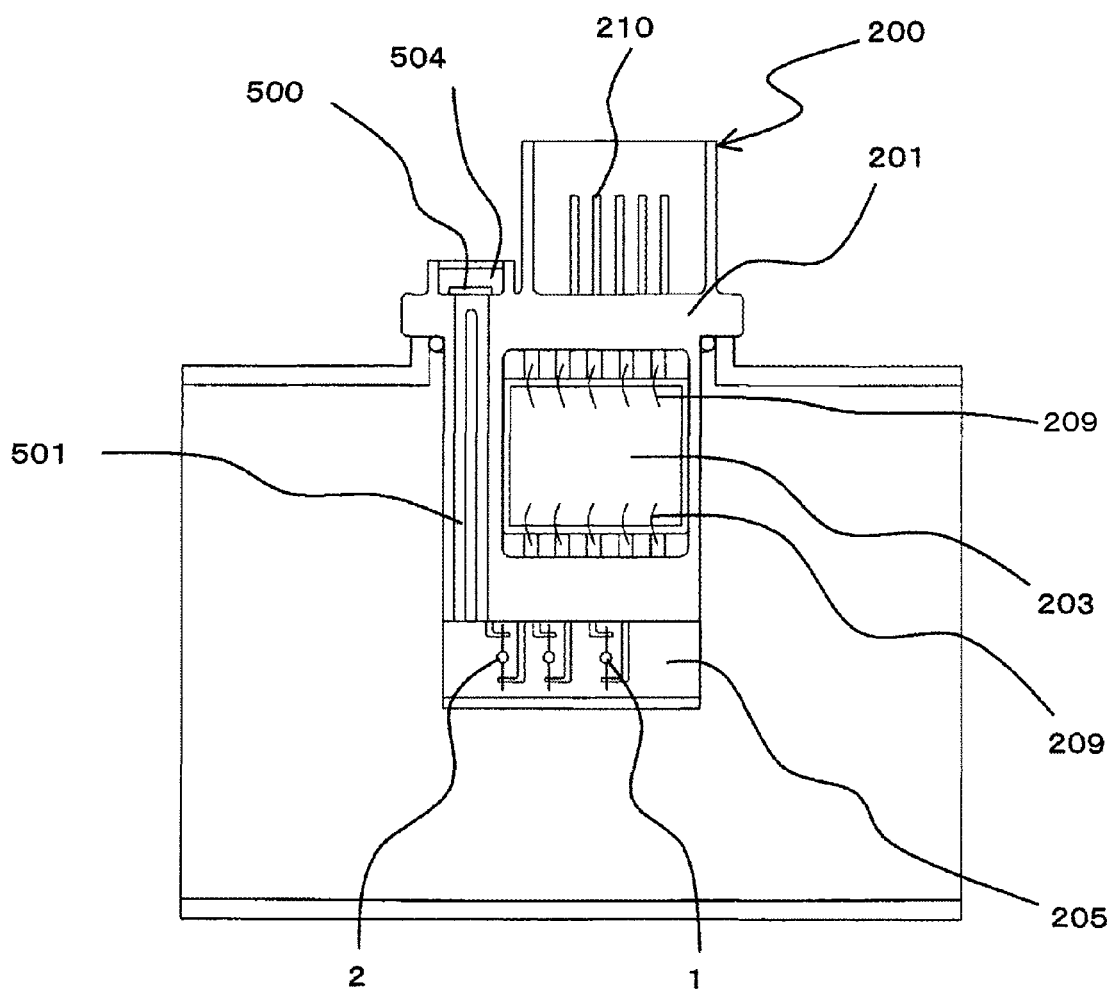
FIG. 5 is a diagram showing the construction of a mass air flow measurement device representing another embodiment of the present invention.

FIG. 5 shows an example of a change of the position at which the humidity sensing device is mounted. A feature of this arrangement resides in that the humidity sensing device 500 is mounted on the housing member 201 at a position outside an outer wall surface of the flow tube member 100 forming the main flow passage 101. The humidity sensing device 500 is connected to the connector terminal 210 directly or via the circuit substrate 203 and bonding members 209 to be electrically connected to the ECU or the like. A space around the place in which the humidity sensing device 500 is placed is filled with an epoxy- or silicon-based sealing material 504 to secure the desired airtightness.

The second bypass passage 501 is connected to the bypass passage 205. The second bypass passage 501 forms an air passage to the position of the humidity sensing device 500 to enable the humidity sensing device 500 to sense humidity. In this arrangement, the distance between the bypass passage 205 and the humidity sensing device 500 can be increased and, therefore, the possibility of an airborne material such as a contaminant or a droplet of water detrimental to humidity measurement reaching the humidity sensing device 500 can be minimized.

Figure 6:
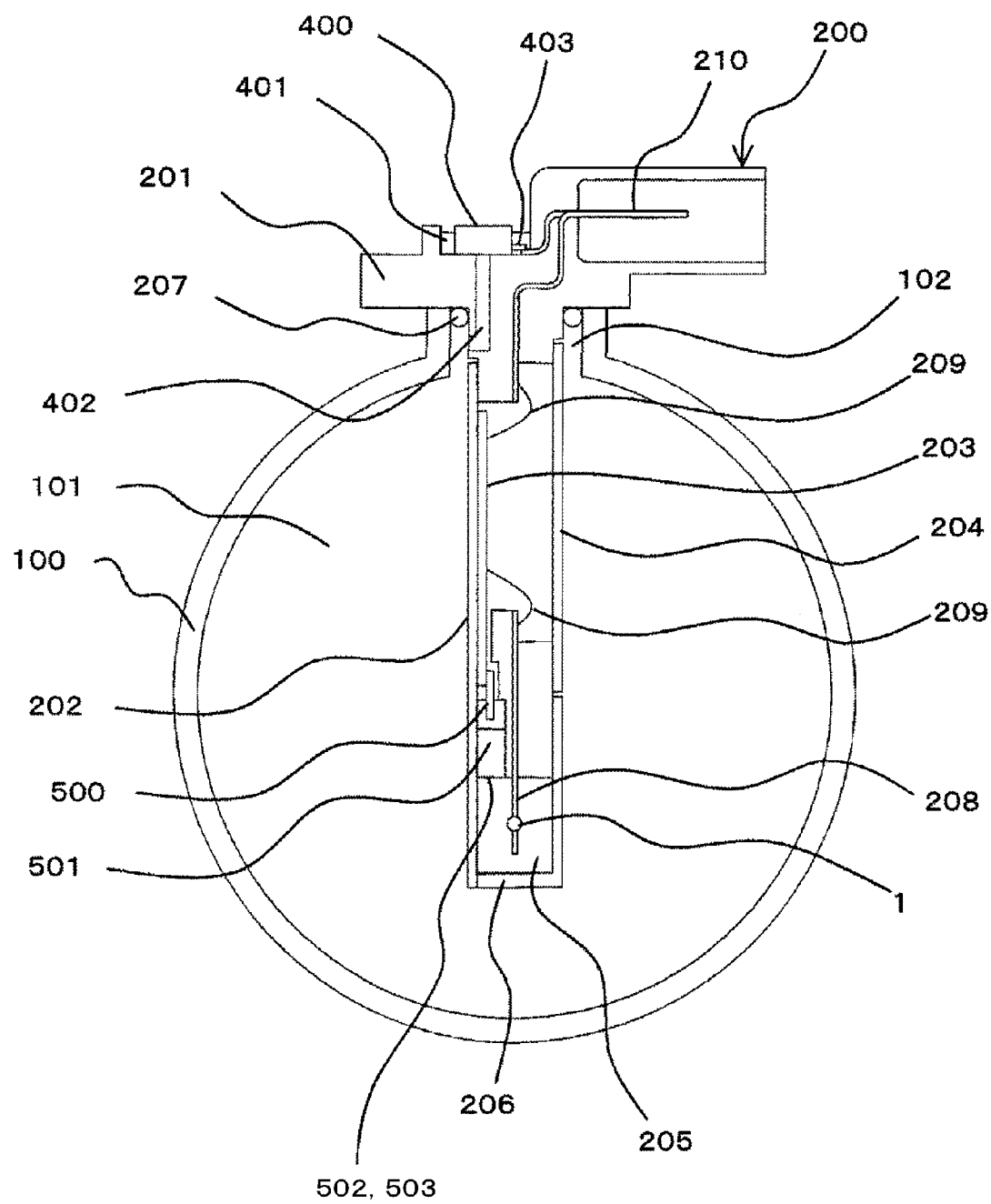
FIG. 6 is a diagram showing the construction of a mass air flow measurement device representing another embodiment of the present invention.

FIG. 6 shows an embodiment in which a pressure sensing function is added to the device shown in FIG. 1.

In a portion of a flow tube member (intake tube member) 100 forming a main flow passage (also referred to as an intake passage or simply as an intake tube) 101, a device insertion slot 102 in which a portion of a heating resistor type mass air flow measurement device 200 is inserted is provided. The heating resistor type mass air flow measurement device 200 integrally incorporating a humidity sensing device 500 is placed in the device insertion slot 102. A housing member 201 provided as a case member for the heating resistor type mass air flow measurement device 200 is attached to the intake tube member 100 to function.

Members constituting the heating resistor type mass air flow measurement device 200 as well as the housing member 201 include a base plate member 202 made of a metallic material or the like, a cover member 204 for protecting a circuit substrate 203, a heating resistor 1 for measuring the air flow, a bypass passage member 206 for forming a bypass passage 205 in which the heating resistor 1 is placed, and a seal member 207 for sealing between the main flow passage 101 and the outside. An inlet of the bypass passage 205 is opened perpendicularly to the direction of flow of air flowing in the main flow passage 101.

A second bypass passage 501 is formed so as to bypass the bypass passage 205. The humidity sensing device 500 is provided in the second bypass passage 501. The humidity sensing device 500 is mounted and fixed on the circuit substrate 203 with a die bonding material (not shown) or the like.

An electrical signal relating to the heating resistor type mass air flow measurement device 200 is connected from the heating resistor 1 to a connector terminal 210 via a terminal member 208, a bonding member 209, the circuit substrate 203 and a bonding member 209 to be electrically connected to an electronic control unit (ECU) or the like.

A signal from the humidity sensing device 500 is connected to the connector terminal 210 via the circuit substrate 203 bonding members 209 to be electrically connected to the ECU or the like.

A second bypass passage inlet 502 and a second bypass passage outlet 503, which respectively are an inlet and an output of the second bypass passage 501, are opened in a wall surface of the bypass passage 205 parallel to the direction of flow of air in the bypass passage 205.

A pressure sensing device 400 is mounted on the housing member 201. A space around the place in which the pressure sensing device 400 is mounted is filled with an epoxy- or silicon-based sealing material 401 to secure the desired airtightness. A pressure intake pipe 402 is disposed in the housing member 201 to enable the pressure sensing device 400 to detect a change in pressure. The pressure intake pipe 402 communicates with the main flow passage 101.

The pressure sensing device 400 has input-output terminals 403, which are electrically connected to the connector terminal 210 by welding or the like to enable input/output between the pressure sensing device 400 and the ECU or the like. Further, the heating resistor type mass air flow measurement device 200 has an air temperature sensing part 2 (not shown) typified by a thermistor type or the like. The air temperature sensing part 2 is mounted in the bypass passage 205 by being welded to a terminal member 208, as is the heating resistor 1.

Thus, the device shown in FIG. 6 is arranged as a multifunctional heating resistor type mass air flow measurement device 200 having a mass air flow sensing function, a humidity sensing function, a pressure sensing function and a temperature sensing function. This construction enables the ECU to obtain various physical quantities including absolute humidity. Through the physical quantities and the flow signal obtained from the heating resistor type mass air flow measurement device 200, elaborate, accurate and reliable control of an internal combustion engine can be supported.

Figure 7:
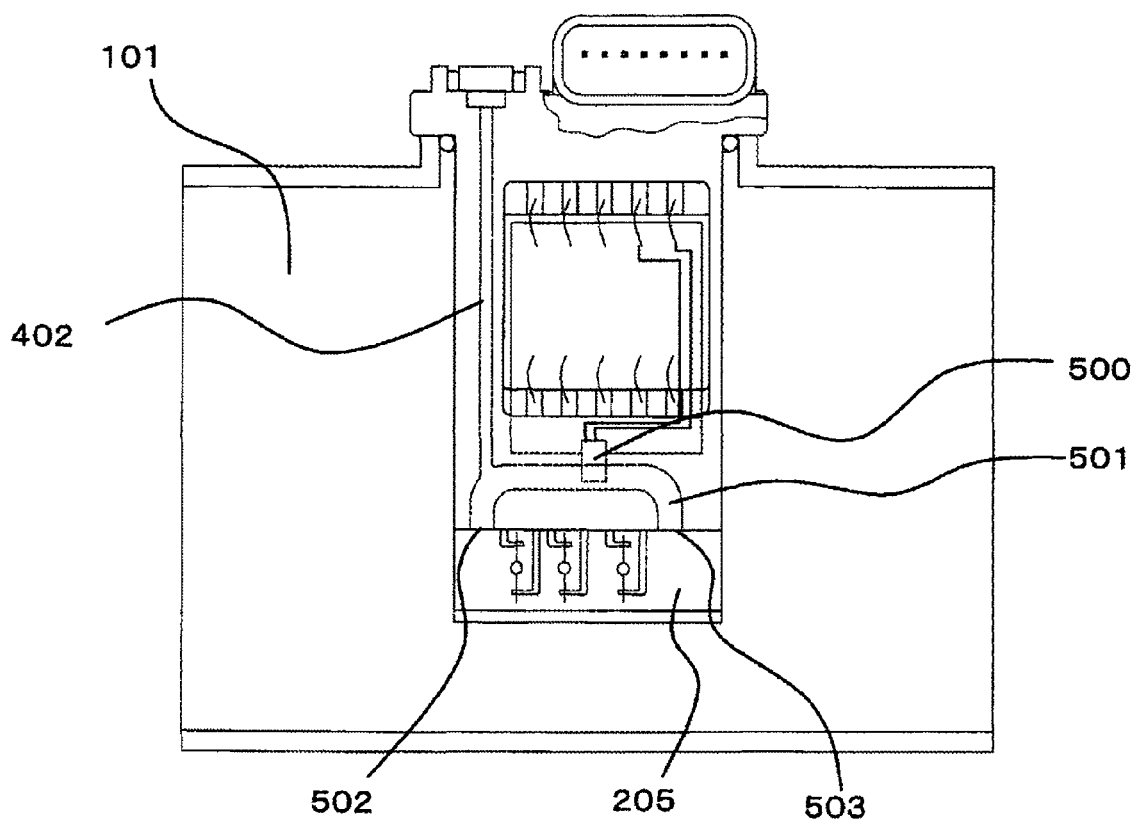
FIG. 7 is a diagram showing the construction of a mass air flow measurement device representing another embodiment of the present invention.

FIG. 7 shows an example of a change of the placement of the pressure intake pipe. In the arrangement shown in FIG. 6, the pressure intake pipe 402 directly communicates with the main flow passage 101 to enable pressure sensing. In the arrangement shown in FIG. 7, the pressure intake pipe 402 is opened in the second bypass passage 501 in which the humidity sensing device 500 is inserted. In this arrangement, the distance between the bypass passage 205 and the pressure sensing device 400 can be increased and, therefore, the possibility of an airborne material such as a contaminant or a droplet of water detrimental to pressure measurement reaching the pressure sensing device 400 can be minimized. Also, sine the second bypass passage 501 is connected to the bypass passage 205 through the second bypass passage inlet 502 and the second bypass passage outlet 503, the average value of internal pressures at two points in the bypass passage 205 can be constantly obtained. In this way, a higher accurate pressure measurement can be achieved.

Figure 8:
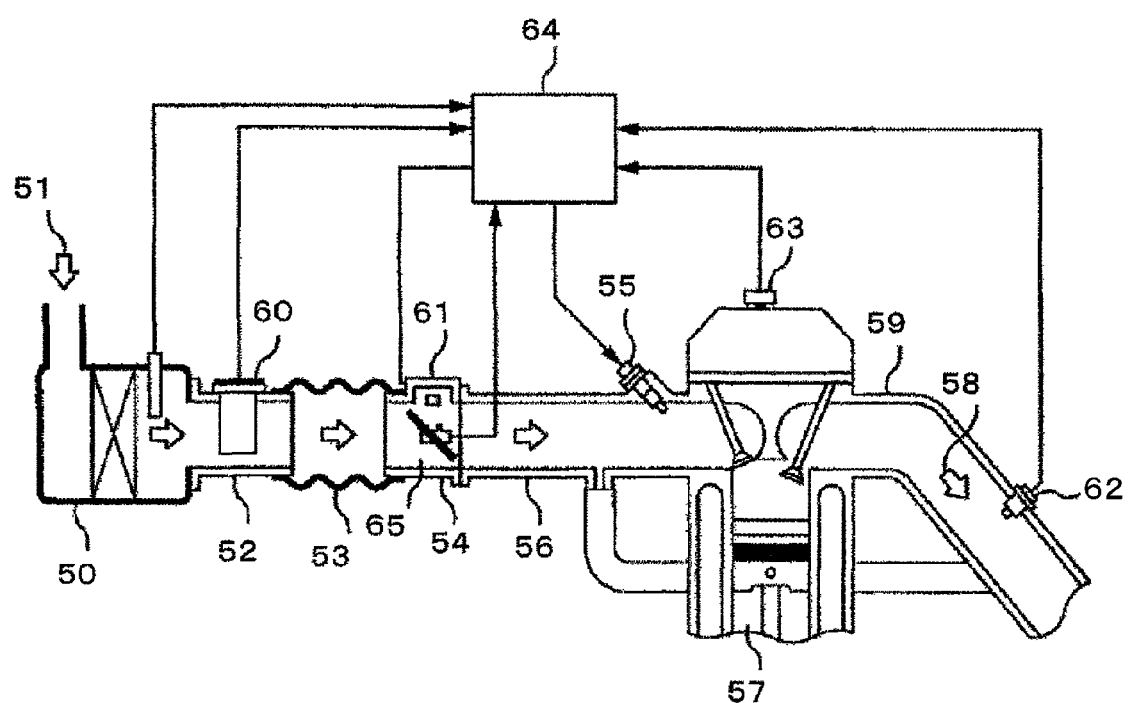
FIG. 8 is a diagram schematically showing the configuration of a system of an internal combustion engine using the heating resistor type mass air flow measurement device.

An embodiment in which the present invention article is applied to an electronic fuel injection type of internal combustion engine will finally be described with reference to FIG. 8. Intake air 51 drawn in from an air cleaner box 50 is drawn into an engine cylinder 57 via a flow tube 52 in which the heating resistor type mass air flow measurement device 200 is inserted, an intake air duct 53, a throttle body 54 and an intake manifold 56 with an injector 55 to which a fuel is supplied. On the other hand, a gas 58 generated in the engine cylinder 57 is discharged via an exhaust manifold 59.

An engine control unit 64 supplied with various signals including a mass air flow signal, a humidity signal, a pressure signal, a temperature signal output from an integrated bypass type mass airflow sensor 60 of the heating resistor type mass air flow measurement device 200, a throttle value angle signal output from a throttle angle sensor 61, an oxygen concentration signal output from an oxygen meter 62 provided on the exhaust manifold 59, and an engine speed signal output from an engine speed meter 63 obtains an optimum fuel injection amount and an idle air control valve opening by computing these signals one by one, and controls the above-mentioned injector 55 and an idle air control valve 65 by using the obtained values.

What is claimed is:

1. A mass intake air flow measurement apparatus integrally incorporating a mass air flow measurement device for measuring a mass intake air flow in an air intake tube, and a humidity sensing device for sensing humidity in the air intake tube, said mass intake air flow apparatus comprising:
 a mass air flow sensing element for sensing said mass intake air flow, the mass air flow sensing element being mounted in a first bypass passage into which part of air flowing in the air intake tube is drawn; and
 a humidity sensing device for sensing humidity, the humidity sensing device being mounted in a second bypass passage opened in the first bypass passage;
 wherein the second bypass passage is formed so as to bypass a portion of the first bypass passage.

2. The mass intake air flow measurement device according to claim 1, wherein:
 an inlet of the first bypass passage comprises an opening that is perpendicular to the direction of flow of air flowing in the air intake tube; and
 an inlet of the second bypass passage comprises an opening parallel to the direction of flow of air flowing in the first bypass passage.

3. The mass intake air flow measurement device according to claim 2, wherein the first bypass passage has at least one bend.

4. The mass intake air flow measurement device according to claim 2, wherein the sectional area of a portion of the first bypass passage is reduced.

5. The mass intake air flow measurement device according to claim 4, wherein the portion of the first bypass passage whose sectional area is reduced is positioned between the inlet and an outlet of the second bypass passage.

6. The mass intake air flow measurement device according to claim 1, wherein the humidity sensing device for sensing humidity in the air intake tube is positioned outside an outer wall surface of an air intake tube member constituting the air intake tube.

7. A mass intake air flow measurement apparatus having integrally incorporated therein a mass air flow measurement device for measuring a mass intake air flow in an air intake tube, a pressure sensing device for sensing the pressure in the air intake tube, a temperature sensing device for sensing the temperature in the air intake tube, and a humidity sensing device for sensing humidity in the air intake tube, said mass intake air flow measurement apparatus comprising:
 a mass air flow sensing element for sensing said mass intake air flow, the mass air flow sensing element being mounted in a first bypass passage which diverts a portion of a main air flow in the air intake tube; and
 a humidity sensing device for sensing humidity, the humidity sensing device being mounted in a second bypass passage formed so as to bypass a portion of the first bypass passage.

8. The mass intake air flow measurement device according to claim 7, wherein:
 a pressure intake pipe is connected to a portion of the second bypass passage incorporating the humidity sensing device; and
 the pressure intake pipe and the pressure sensing device are connected to each other.

9. The mass intake air flow measurement device according to claim 8, wherein the pressure sensing device is positioned outside an outer wall surface of a member constituting the air intake tube.

10. A sensor apparatus comprising:
 an intake air tube that forms a main air flow passage;
 a first bypass passage which is disposed in said main air flow passage and diverts a portion of a main air flow in said main air flow passage, forming a first bypass air flow in said first bypass passage;
 a second bypass passage which opens to said first bypass passage and diverts a portion of said first bypass air flow, forming a second bypass air flow in said second bypass passage;
 a mass air flow sensing element mounted in said first bypass passage, for measuring said main air flow; and
 a humidity sensing device mounted in said second bypass passage, for sensing humidity in said main air flow;
 wherein said second bypass passage is configured to bypass a portion of the first bypass passage.

* * * * *